United States Patent [19]

Sempel

[11] 4,423,387

[45] Dec. 27, 1983

[54] CURRENT MIRROR ARRANGEMENT

[75] Inventor: Adrianus Sempel, Eindhoven, Netherlands

[73] Assignee: U.S. Philips Corporation, New York, N.Y.

[21] Appl. No.: 235,219

[22] Filed: Feb. 17, 1981

[30] Foreign Application Priority Data

Mar. 13, 1980 [NL] Netherlands ........................ 8001492

[51] Int. Cl.[3] ........................... H03F 1/34; H03F 3/04

[52] U.S. Cl. ........................................ 330/85; 330/288

[58] Field of Search ............... 330/288, 257, 290, 300, 330/85; 307/297; 323/315, 318

[56] References Cited

U.S. PATENT DOCUMENTS 4,317,054 2/1982 Caruso ................................ 307/297

*Primary Examiner*—James B. Mullins
*Assistant Examiner*—Gene Wan
*Attorney, Agent, or Firm*—Robert T. Mayer; Bernard Franzblau

[57] ABSTRACT

A current source arrangement which may be constituted by a current mirror or by a multiple current source, having a first current circuit and a second current circuit, each equipped with a semiconductor device in series with a resistor. For the purpose of noise reduction the difference between the voltages across the two resistors is negatively fed back to the second current circuit.

19 Claims, 6 Drawing Figures

CURRENT MIRROR ARRANGEMENT

Figure 1:
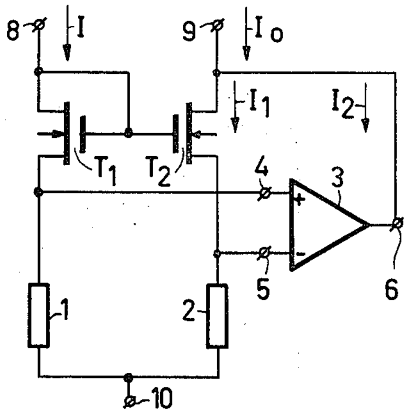

.The invention relates to a current source arrangement comprising a first current circuit connected between a first terminal and a common terminal, which first current circuit comprises at least the main current path of a first semiconductor device in series with a first resistor, and comprising a second current circuit connected between a second terminal and the common terminal, which second current circuit comprises at least the main current path of a second semiconductor device and a second resistor, the two semiconductors being connected in parallel with respect to their drives.

Such current source arrangements are known as current-mirror arrangements, inter alia from "Electronic Products Magazine," June 21, 1971, pages 43–45 and are frequently employed in integrated circuits. Many variants are known, for example, the first semiconductor device may be a diode or a transistor connected as a diode, the second semiconductor device may be a transistor driven by the voltage across said diode, the two semiconductors may be transistors with interconnected base or gate electrodes driven from the first terminal and in which the first semiconductor device may be a transistor and the second semiconductor device a diode or a transistor connected as a diode, which is included in the emitter or source circuit of a third transistor whose base or gate electrode is connected to the first terminal. The current mirror action is based on the relative proportions of the two semiconductors, the two resistors being proportioned accordingly. These resistors are frequently incorporated in order to increase the accuracy of the current mirror arrangement, while as an additional effect the noise contribution of the current mirror arrangement is reduced.

By means of positive feedback between the first terminal and the control electrodes of both transistors constituting the first and the second semiconductor junctions, a current mirror is obtained and by driving said control electrodes with a constant or control voltage a current source is obtained.

Especially when field-effect transistors are employed, the noise contribution of the current source arrangement is often comparatively high. It is an object of the invention to provide a current-source arrangement of the type mentioned in the preamble having a reduced noise contribution.

To this end the invention is characterized in that the current-source arrangement comprises an active negative feedback circuit with a differential input coupled between the ends of the first and the second resistors which are remote from the common terminal. An output of this circuit is coupled to the second current circuit to provide negative feedback so as to counteract a variation of the voltage across the second resistor relative to the voltage across the first resistor.

The invention is based on the recognition that, because in the case of a current-mirror arrangement a current from outside the current mirror arrangement flows through the first resistor, only the inherent noise contribution of the first resistor appears across said resistor and that said resistor may be employed as a low-noise reference for the second current circuit which constitutes the output current circuit. In the case of an optimum negative feedback the output current then contains only the inherent noise contribution of the first resistor, and the noise contributions of the two semiconductors and the second resistor are eliminated. An important additional effect is that owing to this step the output impedance of the current mirror arrangement is increased without the input impedance being increased and the transmission accuracy is increased and to a greater extent determined by the accuracy of the ratio of the two resistors.

In the case of a current source the step in accordance with the invention means that the noise contributions of the first and the second current circuits are highly correlated, which results in a noise reduction.

A first embodiment of a current source arrangement in accordance with the invention may further be characterized in that the active negative feedback circuit comprises a transconductance amplifier for converting the voltage difference between the voltages across the first and the second resistors, which amplifier has a transconductance which is substantially equal to the inverse of the value of the second resistor, and for injecting a current determined thereby into the second current circuit with a polarity such that the said negative feedback is obtained.

A symmetrical version of this embodiment may be characterized in that the active negative feedback circuit comprises a transconductance amplifier for converting the voltage difference between the voltages across the first and the second resistor, which amplifier has a transconductance which is substantially equal to but smaller than the inverse of two times the value of the second resistor, and a differential output for injecting a current determined thereby into the second current circuit and a current which is in phase opposition thereto into the first current circuit, with a polarity such that said negative feedback is obtained.

In the case of a current ratio unequal to unity, this symmetrical embodiment may further be characterized in that the current source arrangement is adapted to obtain a current in the second current circuit which is in a ratio of n:1 to the current in the first current circuit in that the first resistor has a value which is n times (n×) as great as that of the second resistor and in that the first and the second semiconductor devices are proportioned accordingly. The transconductance amplifier is designed so that the current injected into the first current circuit has a value equal to (1/n) x the value of the current injected into the second current circuit.

With respect to the drive of the first and the second current circuits of the current source arrangement, the symmetrical embodiment may further be characterized in that current injection is effected at the junction points between the first semiconductor device and the first resistor and between the second semiconductor device and the second resistor.

A particularly advantageous embodiment of a current mirror arrangement in accordance with the invention, in which the first and the second semiconductor devices are respectively constituted by a first and a second insulated-gate field-effect transistor with interconnected gate electrodes. The field-effect transistors each comprise a semiconductor substrate underneath an insulated-gate electrode between a source and a gate terminal, in which substrate a conductive channel is formed by driving said gate electrode and which substrate is provided with a terminal. This embodiment may be realized without the use of additional elements and is characterized in that the active negative feedback circuit is formed by connecting said substrate terminal of the first field-effect transistor to the source electrode of the second field-effect transistor.

A symmetrical version of this special embodiment is then characterized in that the substrate terminal of the second field-effect transistor is connected to the source electrode of the first field-effect transistor.

Figure 2:
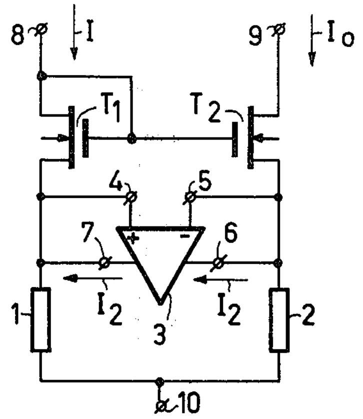
Figure 3:
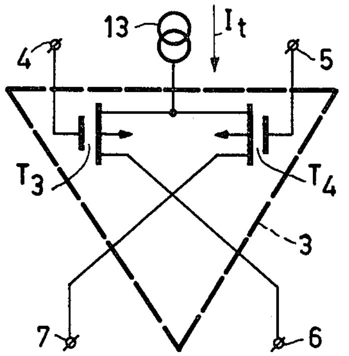
Figure 4A:
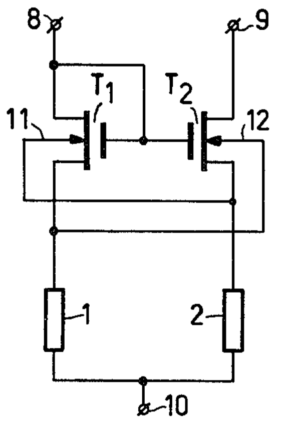
Figure 4B:
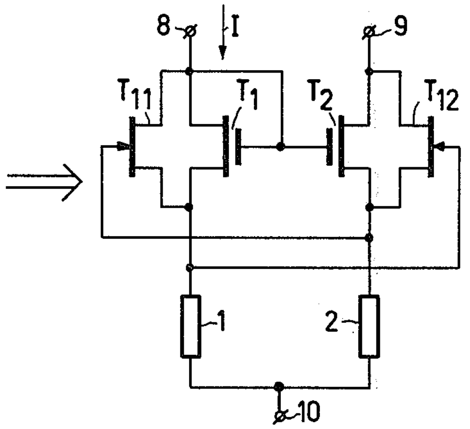
Figure 5:
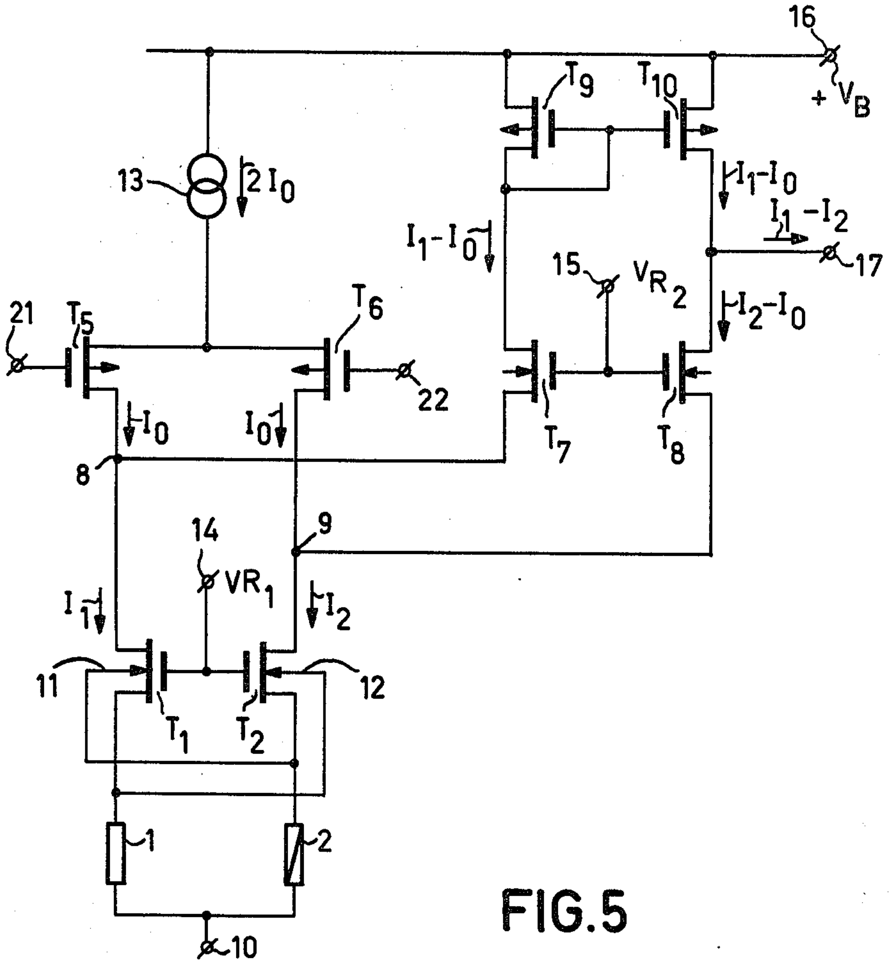

The invention will now be described in more detail with reference to the drawing, in which:

FIG. 1 shows a first embodiment of a current mirror arrangement in accordance with the invention, FIG. 2 shows a symmetrical version of the embodiment of FIG. 1, FIG. 3 shows an example of the transconductance amplifier 3 employed in the arrangement of FIG. 2, FIG. 4*a* shows a preferred embodiment of a current-mirror arrangement in accordance with the invention, FIG. 4*b* being an equivalent diagram of said arrangement in order to illustrate the operation of the arrangement of FIG. 4*a*, and FIG. 5 shows a differential amplifier with a current source arrangement in accordance with the invention as a load circuit.

FIG. 1 shows a first embodiment of a current mirror in accordance with the invention. It comprises a first n-channel transistor $T_1$ and a second n-channel transistor $T_2$. The drain electrode of transistor $T_1$ is connected to the gate electrode of said transistor $T_1$ via a positive feedback path, in the present case an interconnection, and to an input terminal 8 of the current mirror. The source electrode of transistor $T_1$ is connected to a common terminal 10 via a resistor 1. The gate electrode of transistor $T_2$ is connected to the gate electrode of transistor $T_2$, the drain electrode is connected to an output terminal 9 of the current mirror and the source electrode is connected to the common terminal 10 via a resistor 2.

In this embodiment the combination of the transistors $T_1$ and $T_2$ and the resistors 1 and 2 form a simple version of a current mirror, to which many modifications are possible. A current I, which is applied to the input terminal 8, is "reflected" to the output channel 9, where it appears as a current $I_1$ which is in a fixed ratio, for example 1, to the input current I. With respect to the noise, the resistor 1, apart from its inherent thermal noise, provides no additional contribution because it receives the externally determined input current I. Additional noise sources are transistor $T_1$ with a noise voltage $e_1$, transistor $T_2$ with a noise voltage $e_2$, and resistor 2 with a noise voltage $e_3$. These uncorrelated noise voltages result in a noise component $\Delta I$ in the output current $I_1$, which component is determined by said uncorrelated noise sources and the value R of resistor 2, so that: $I_1=I^1+\Delta I$, where $I^1=nI$ represents the "reflected" input current I and where $\Delta I$ also contains a component which represents a deviation from the factor n, which factor is determined by the resistance ratio R2/R1, as a result of a deviation of the geometry ratio of transistors $T_1$ and $T_2$ from said factor n.

Since, apart from the noise voltage as a result of the noise contained in the input current I and the inherent thermal noise of resistor 1, no noise voltage is present, said resistor may be employed as a reference for noise compensation in accordance with the insight on which the invention is based. For this purpose, the voltage across resistor 2, which contains the voltage caused by the noise component $\Delta I$ present in the output current $I_1$, is compared with the voltage across resistor 1. In the embodiment of FIG. 1 this is effected with a transconductance amplifier 3. As input difference voltage this amplifier receives the noise voltage $-R\ \Delta I$ and at its output 6 it supplies a current $I_2=-GR\ \Delta I$, where G is the transconductance of said amplifier. Thus, the current $I_0$, which consists of the current $I_1$ to which is added the output current $I_2$ of amplifier 3, will be $I_0=I_1+I_2=-GR\ \Delta I+I^1+\Delta I$. The total output current $I_0$ is thus compensated for internal noise for $GR=1$ or $G=(1/R)$ and in the ideal case only contains the thermal noise of resistor 1 and the noise contained in the input current I. This step is applicable in this form, regardless of the current mirror ratio $n=(I^1/I)$, because only the value R of the resistor 2 plays a part in the requirement for the transconductance G.

An additional though not insignificant advantage of the invention is that it provides an increase of the output impedance of the current mirror. Indeed, a reaction of the voltage at terminal 9 on the current $I_1$ is counteracted by negative feedback via amplifier 3. The amplifier 3 has no influence on the input impedance of the mirror.

Alternatively, the current $I_2$ may also be injected at the source electrode of transistor $T_2$.

In the current mirror in accordance with FIG. 1 the compensation in accordance with the invention is applied in the output circuit, but may also be effected symmetrically, which will be illustrated by means of FIG. 2.

FIG. 2 shows a current mirror in accordance with FIG. 1 comprising transistors $T_1$ and $T_2$ and resistors 1 and 2. Furthermore, the current mirror comprises a transconductance amplifier 3 similar to that in the arrangement of FIG. 1, but in which the output 6 is connected to the source electrode of transistor $T_2$. The transconductance amplifier 3 is further provided with an output 7, at which a current $I_2$ of a polarity opposite to the polarity of the current $I_2$ at output 6 appears. The output 7 is connected to the source electrode of transistor $T_1$.

If an input current I flows through transistor $T_1$ and resistor 1, this current is "reflected" to transistor $T_2$ and resistor 2 and a noise component $\Delta I$ is added thereto. Furthermore, amplifier 3 supplies a current $I_2$ to the resistor 1 and a current $-I_2$ to the resistor 2 so that the input difference voltages $\Delta V$ of amplifier 3 will be: $\Delta V=R(I+I_2)-R(I-I_2+\Delta I)=2RI_2-R\ \Delta I$, where R is the resistance value of the resistors 1 and 2. If $I_2=G\ \Delta V$ for amplifier 3, this expression becomes: $\Delta V=2RG\Delta V-R\Delta I$, from which it follows that the noise component $\Delta I$ will be zero for $G=(1/2R)$.

In the embodiment of FIG. 2 the step in accordance with the invention also has the important additional effect that the output impedance of the current mirror is increased. A drawback is the cross-coupling between the source electrodes of transistors $T_1$ and $T_2$ via amplifier 3, which leads to an unstable situation—a flipflop configuration—if the loop gain becomes greater than 1. However, the signal transmission $I_0/I$ is maintained, but the noise increases if the loop gain in the loop $T_1$, $T_2$, amplifier 3 is greater than unity. For this reason the requirement $G=(1/2R)$ cannot be met in an optimum manner. The requirement then becomes: $G\leqq(1/2R)$.

Alternatively the currents $I_2$ may also be injected at the input and output terminals 8 and 9.

In the same way as in the current mirror of FIG. 1, it is possible to select a gain or attenuation $I_0=nI$, where $n\neq1$, for the current mirror in accordance with FIG. 2. For this purpose the values of the resistors 1 and 2 should be in ratio 1:(1/n) and the width (W) - length (L) ratios of the channels of transistor $T_1$ ($W_1L_1$) and transistor $T_2$ ($U_2/L_2$) should be $(W_1/L_1):(W_2/L_2)=1:n$. Using the expressions found, it follows that for amplifier 3 compensation occurs if $G=(1/2R)$, provided that the current appearing at output 6 is nx as great, i.e. equal to $NI_2$, where $I_2=G\Delta V$, as the current at output 7 of the transconductance amplifier 3.

FIG. 3 shows an example of a transconductance amplifier 3. It comprises a p-channel transistor $T_3$ and p-channel transistor $T_4$, whose source electrodes are connected to a quiescent-current source 13 with a current $I_t$. The gate electrodes of transistors $T_3$ and $T_4$ respectively constitute the inputs 4 and 5 of amplifier 3 and the drain electrodes of transistors $T_3$ and $T_4$ respectively constitute the outputs 6 and 7 of amplifier 3. The transconductance G is then $G=\sqrt{2\beta I_0}$, where $(\beta/2)$ is the slope of the transistors $T_3$ and $T_4$, which is proportional to the width - length ratio (W/L) of their channels.

In the case of a current mirror gain factor equal to n, as in the example described with reference to FIG. 2, amplifier 3 should be designed so that the current at output 6 is n times as great as that at output 7. This can be achieved by selecting the width-length ratio ($W_3/L_3$ of the channel of transistor $T_3$ to be n× as great as said ratio ($W_4/L_4$) of the channel of transistor $T_4$, so that the quiescent currents through these transistors as well as their slopes $\beta$ are in a ratio of n:1 and the gain factors to the outputs 6 and 7 are in a ratio of n:1.

The step in accordance with the invention only has a favourable effect if the noise contribution of the transconductance amplifier 3 is substantially smaller than that of the original current mirror without the step in accordance with the invention. In the case of the transconductance amplifier of FIG. 3 the noise contribution can be minimized by selecting the smallest possible practical value for the quiescent current $I_t$. In order to obtain the desired transconductance $G=(1/2R)$, the (W/L) factors should be selected accordingly.

FIG. 4*a* shows a very favourable embodiment of a circuit arrangement in accordance with the invention. The current mirror again comprises transistors $T_1$ and $T_2$ and resistors 1 and 2. However, the back-gates, which are situated on another side of the channel than the insulated-gate electrodes and which constitute a junction field-effect transistor together with the channel and the source and drain electrode, are connected via terminals 11 and 12 respectively, to the source electrode of the respective other transistor $T_2$ or $T_1$. FIG. 4*b* represents the equivalent diagram of this configuration, the effect of the driven back-gates 11 and 12 being obtained by connecting an n-channel junction field-effect transistor $T_{11}$ or $T_{13}$ in parallel with the respective transistor $T_1$ or $T_2$. The junction field-effect transistors $T_{11}$ and $T_{12}$ may then be regarded as the amplifier 3.

A current I through input 8 flows completely through resistor 1, so the voltage across resistor 1 is noise-free, ignoring the noise present in the current I. The drive at the back-gates now results in such a drive of transistor $T_2$ that the voltage across resistor 2 follows the voltage across resistor 1 more closely, which voltage is a low-noise voltage, so that also in this case a noise reduction and an increase in output impedance is achieved relative to the current mirror without this step. Here, a mathematical explanation is less simple owing to the combination of the amplifier 3 (the junction field-effect transistors $T_{11}$ and $T_{12}$) with the current-mirror transistors $T_1$ and $T_2$, and is omitted for the sake of simplicity. The operation may be explained as follows: An increase of the current in resistor 2 causes an increase of the drive of the substrate transistor $T_{11}$ and hence a reduction of the voltage at the gate electrode of transistor $T_1$ and thus on the gate electrode of transistor $T_2$, so that such a current increase is counteracted by the drive of transistor $T_2$. This control is increased because the substrate transistor $T_{12}$ receives a constant voltage at its gate electrode via resistor 1 and receives a voltage which is increased as a result of the initial increase of the voltage across resistor 2 at its source electrode, so that the conduction of said substrate transistor $T_{12}$ is also reduced.

From the point of view of noise reduction the arrangement of FIG. 4 would also function if the gate electrode of the substrate transistor $T_{12}$ would receive constant voltage. However, this results in a deterioration of the current mirror operation at varying input current. However, it is possible to connect the two substrate terminals to the source electrode of transistor $T_2$. In that case compensation is obtained in that a variation of the voltage across resistor 2 causes the voltage at the back-gate of transistor $T_1$ to vary in phase and thus the voltage at the insulated gate electrode of transistor $T_1$ to vary in phase-opposition thereto and thus to that of transistor $T_2$. Therefore, a variation of the voltage across resistor 2 is counteracted relative to the voltage across resistor 1. It is alternatively possible to connect two substrate terminals to the source electrode of transistor $T_1$. In that case the source electrode of transistor $T_{hd\ 12}$ is driven, relative to the gate electrode of transistor $T_{12}$, by the variation of the voltage across resistor 2 relative to the voltage across resistor 1.

In the embodiment of FIG. 4 and the associated variant it is also possible to realize current mirror factors n unequal to unity. The adaptation of amplifier 3 mentioned in the description with reference to FIGS. 2 and 3 is then effected automatically because, in the case of a variation of the channel dimensions of the transistors $T_1$ and $T_2$ relative to each other, the dimensions of the substrate transistors $T_{11}$ and $T_{12}$ will be changed accordingly.

In the embodiments shown in FIGS. 1 to 4 the step in accordance with the invention is applied to a current mirror. The noise in the output circuit is then reduced in that the step in accordance with the invention ensures that the output current $I_0$ is equal or proportional to the input current I to a greater extent than without the step in accordance with the invention. If the step in accordance with the invention is applied to a current source arrangement with parallel transistors $T_1$ and $T_2$, i.e. in that the positive feedback between the drain electrode and source electrode of transistor $T_1$ is interrupted and in that the common gate connection of transistors $T_1$ and $T_2$ receives a bias voltage, the step in accordance with the invention ensures that the two output currents on junction points 8 and 9 are highly equal or proportional. For the noise contributions of $T_1$ and $T_2$ this means that these are highly correlated. For many applications this may lead to noise reduction, for example when such a current source arrangement is employed as a symmetrical load circuit of a differential amplifier, of which an example is shown in FIG. 5.

FIG. 5 shows a differential amplifier with transistors $T_5$ and $T_6$ connected as a differential pair with a quiescent current source 13 supplying a current $2I_v$ included in the common source circuit. The drains of these transistors are connected to the terminals 8 and 9 of the circuit arrangement of FIG. 4*a*, which because the common gate connection of transistors $T_1$ and $T_2$ is connected to a point of reference voltage $V_{R1}$, are arranged as two coupled current mirrors. Owing to the step in accordance with the invention the currents $I_1$ and $I_2$ in the drain circuits of the transistors $T_1$ and $T_2$ are highly equal and the noise components in said currents are highly correlated.

Via level-shifting transistors $T_7$ and $T_8$ terminals 8 and 9 are respectively connected to the input and output of a current mirror including transistors $T_9$ and $T_{10}$, said output being connected to an output 17.

In the absence of a signal on the gate of transistors $T_5$ and $T_6$ both transistors conduct a current equal to $I_0$. Thus, a current $I_1-I_0$ will flow to the input of the current mirror comprising transistors $T_9$and $T_{10}$ and a current $I_2-I_0$ to the output of said current mirror, so that a current $I_1-I_2$ will flow to output 17. Since the noise components in the currents $I_1$ and $I_2$ are highly correlated, these components as well as the d.c. components will largely cancel each other at output 17.

A signal between the gates of transistors $T_5$ and $T_6$ gives rise to a signal current at output 17.

The current mirror comprising transistors $T_9$ and $T_{10}$ can be noise-compensated in accordance with the invention, but this is not necessary because transistors $T_9$ and $T_{10}$ can carry a substantially smaller direct current $I_1-I_0$ and $I_2-I_0$ than transistors $T_1$ and $T_2$ and thus have substantially smaller noise contributions.

The invention is not limited to the embodiments shown. Modifications are possible with respect to the use of opposite conductivity types, the use of more complete current mirror structures and the use of a bipolar version.

What is claimed is:

1. A current-source arrangement comprising, a first current circuit coupled between a first terminal and a common terminal, said first circuit comprising at least the main current path of a first semiconductor device connected in series with a first resistor, a second current circuit coupled between a second terminal and the common terminal, said second current circuit comprising at least the main current path of a semiconductor device and a second resistor, the two semiconductor devices being connected in parallel with respect to their drives, an active negative feedback circuit having a differential input and an output, means coupling said differential input between the ends of the first and the second resistor which are remote from the common terminal, and means coupling said output to the second current circuit to provide negative feedback so as to counteract a variation of the voltage across the second resistor relative to the voltage across the first resistor.

2. A current source arrangement as claimed in claim 1, wherein the first and the second semiconductor devices comprise a first and a second insulated-gate field-effect transistor with interconnected gate electrodes, said field effect transistors each comprise a semiconductor substrate underneath an insulated-gate electrode between a source and a gate terminal, in which substrate a conductive channel is formed by driving said gate electrode, the substrate including a terminal, and the active negative feedback circuit being formed by connecting said substrate terminal of the first field-effect transistor to the source electrode of the second field effect transistor.

3. A current source arrangement as claimed in claim 2, characterized in that a substrate terminal of the second field-effect transistor is connected to the source electrode of the first field-effect transistor.

4. A current-source arrangement as claimed in claim 1, wherein the active negative feedback circuit comprises a transconductance amplifier having a transconductance G which is substantially equal to the reciprocal of the resistance value of the second resistor, said amplifier being operative to convert the voltage difference between the voltages across the first and second resistors into a current determined thereby and which is injected into the second current circuit with a polarity so as to derive said negative feedback.

5. A current source arrangement as claimed in claim 1, wherein the active negative feedback circuit comprises a transconductance amplifier for converting a voltage difference between the voltages across the first and second resistors, said amplifier having a transconductance G which is substantially equal to but smaller than the reciprocal of two times the resistance value of the second resistor, said transconductance amplifier providing a differential output for injecting first and second currents determined by said voltage difference into the first and second current circuits, respectively, said first and second currents being in phase opposition and with a polarity so as to derive said negative feedback.

6. A current source arrangement as claimed in claim 5 wherein the first resistor has a resistance value which is n times that of the resistance value of the second resistor and the first and second semiconductor devices are proportioned accordingly, whereby the current-source arrangement provides a current in the second current circuit which is in a ratio of n:1 to the current in the first current circuit, the transconductance amplifier being designed so that the current injected into the first current circuit has a value equal to (1/n) times the value of the current injected into the second current circuit.

7. A current source arrangement as claimed in claims 4 or 6 wherein the current injection is effected at the junction points between the first semiconductor device and the first resistor and between the second semiconductor device and the second resistor.

8. A circuit arrangement comprising, a first series circuit including a first semiconductor device and a first resistor coupled between a first terminal and a common terminal, a second series circuit including a second semiconductor device having a control electrode coupled to the first terminal and a second resistor, means coupling said second series circuit between a second terminal and said common terminal, whereby first and second currents are caused to flow in said first and second series circuits, respectively, via said first and second terminals, respectively, in a fixed relationship to one another, a negative feedback circuit including an amplifier with first and second input terminals coupled to corresponding circuit points in said first and second series circuits, respectively, and an output coupled only to a circuit point in the second series circuit to provide a negative feedback signal thereby to reduce the circuit noise inherent in the circuit arrangement.

9. A circuit arrangement as claimed in claim 8 wherein said first and second semiconductor devices each comprise a transistor with the first transistor connected as a diode and with the control electrodes of the first and second transistors connected together, wherein said corresponding circuit points in the first and second series circuits comprise junction points between the first and second resistors and the first and second transistors, respectively, and said circuit point to which the amplifier output of the negative feedback circuit is coupled comprises that terminal of the second transistor closest to said second terminal of the circuit arrangement.

10. A current mirror comprising, an input terminal, an output terminal, a common terminal, first and second resistors, means connecting a first semiconductor device in a first series circuit with said first resistor between the input terminal and the common terminal, a second semiconductor device having a control electrode, means connecting the second semiconductor device in a second series circuit with said second resistor between the output terminal and the common terminal and with said control electrode coupled to said input terminal, thereby to derive a current at the output terminal having a given relationship to a current at the input terminal, and a negative feedback amplifier having first and second inputs coupled to corresponding first and second circuit points in the first and second series circuits, respectively, and an output coupled to a terminal of the second semiconductor device other than the control electrode so as to provide a negative feedback.

11. A current mirror as claimed in claim 10 wherein said negative feedback amplifier comprises a transconductance amplifier having a value of transconductance G equal to 1/R where R is the resistance value of the second resistor, said amplifier injecting a current into the second series circuit of a polarity to provide a negative feedback that counteracts a variation in voltage across the second resistor relative to the voltage across the first resistor.

12. A current mirror as claimed in claim 10 wherein said first and second semiconductor devices each comprise an FET transistor with the first semiconductor device transistor connected as a diode and having a control electrode connected to said control electrode of the second semiconductor device transistor.

13. A current mirror as claimed in claim 10 wherein said negative feedback amplifier further comprises a second output coupled to a terminal of the first semiconductor device through which flows the current flowing to the input terminal, the first and second amplifier outputs injecting currents into the first and second series circuits that are in phase opposition and of a polarity to produce said negative feedback.

14. A current mirror as claimed in claim 13 wherein the negative feedback amplifier comprises a transconductance amplifier with the first and second inputs and the first and second outputs forming a differential input and a differential output, respectively, of the transconductance amplifier, said amplifier having a transconductance value G which is approximately equal to but less than 1/2R where R is the resistance value of the second resistor.

15. A current as claimed in claim 14 wherein the resistance value of the first resistor is n times the resistance value of the second resistor and the first and second semiconductor devices are dimensioned in the ratio of 1:n, the transconductance amplifier injecting a current into the first series circuit that is 1/n times the value of the current injected into the second series circuit whereby the current mirror produces a current in the second series circuit that is n times the current in the first series circuit.

16. A current mirror as claimed in claim 15 wherein said first and second semiconductor devices each comprise an FET transistor with the first semiconductor device transistor connected as a diode and having a control electrode connected to said control electrode of the second semiconductor device transistor, the width to length ratio (W/L) of the channels of the first and second FET transistors being dimensioned in the ratio of 1:n.

17. A current source arrangement comprising, a first current circuit including a first semiconductor device and a first resistor connected in a first series circuit between a first terminal and a common terminal, a second current circuit including a second semiconductor device and a second resistor connected in a second series circuit between a second terminal and the common terminal, means coupling said first and second current circuits so as derive a current at the second terminal that bears a fixed relationship to a current at the first terminal, and a negative feedback amplifier circuit having a differential input coupled to corresponding circuit points in the first and second current circuits and an output coupled to a circuit point in the second current circuit to supply a current to said second current circuit that provides a negative feedback exclusively to second current circuit.

18. A current source arrangement comprising a semiconductor substrate on which are formed first and second insulated gate field effect transistors with interconnected gate electrodes, means connecting the first transistor in a first series circuit with a first resistor between a first terminal and a common terminal, means connecting said second transistor in a second series circuit with a second resistor between a second terminal and the common terminal, the first FET having its drain and gate electrodes interconnected to form a diode and having a second gate terminal coupled to said substrate in an area adjacent to the first FET to form therewith a junction FET in parallel with the first FET, said second gate terminal being connected to the source electrode of the second FET to form an active negative feedback circuit from which a current is supplied to the second resistor in a sense to counteract a variation of voltage across the second resistor relative to the voltage across the first resistor.

19. A current source arrangement as claimed in claim 18 wherein the second FET includes a second gate terminal coupled to the substrate in an area adjacent the second FET to form therewith a second junction FET in parallel with the second FET, said second gate terminal of the second FET being connected to the source electrode of the first FET to form an active negative feedback circuit so as to provide a symmetrical current source arrangement.

* * * * *

UNITED STATES PATENT AND TRADEMARK OFFICE

CERTIFICATE OF CORRECTION

PATENT NO. : 4,423,387

DATED : December 27, 1983

INVENTOR(S) : ADRIANUS SEMPEL

It is certified that error appears in the above—identified patent and that said Letters Patent is hereby corrected as shown below:

In the Abstract:

Line 3, delete "," (comma)

In the Claims:

Claim 1, line 3, after "first" insert --current--

Claim 8, line 17, after "signal" insert --thereto--

Claim 15, line 1, after "current" insert --mirror--

Claim 17, last line, after "to" insert --the--

Signed and Sealed this

*Third* Day of *April 1984*

[SEAL]

*Attest:*

GERALD J. MOSSINGHOFF

*Attesting Officer* *Commissioner of Patents and Trademarks*